United States Patent
Ramaswamy et al.

(10) Patent No.: US 7,521,356 B2
(45) Date of Patent: Apr. 21, 2009

(54) ATOMIC LAYER DEPOSITION SYSTEMS AND METHODS INCLUDING SILICON-CONTAINING TANTALUM PRECURSOR COMPOUNDS

(75) Inventors: Nirmal Ramaswamy, Boise, ID (US); Eugene Marsh, Boise, ID (US); Joel Drewes, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 461 days.

(21) Appl. No.: 11/217,949

(22) Filed: Sep. 1, 2005

(65) Prior Publication Data

US 2007/0049055 A1 Mar. 1, 2007
US 2008/0299782 A9 Dec. 4, 2008

(51) Int. Cl.
*H01L 21/4763* (2006.01)

(52) U.S. Cl. .............................. 438/627; 257/E21.584; 438/653; 438/656

(58) Field of Classification Search ................. 438/627, 438/653, 656; 257/E21.584
See application file for complete search history.

(56) References Cited

U.S. PATENT DOCUMENTS

| | | | |
|---|---|---|---|
| 4,766,006 A | 8/1988 | Gaczi |
| 5,087,593 A | 2/1992 | Narula |
| 5,256,244 A | 10/1993 | Ackerman |
| 5,350,719 A | 9/1994 | Narula et al. |
| 5,453,527 A | 9/1995 | Baldus et al. |
| 5,576,579 A | 11/1996 | Agnello et al. |
| 5,840,897 A | 11/1998 | Kirlin et al. |
| 5,849,071 A | 12/1998 | Derbenwick et al. |
| 5,916,634 A | 6/1999 | Fleming et al. |
| 5,981,331 A | 11/1999 | Tsunemine |
| 5,997,949 A | 12/1999 | Nicolet et al. |
| 6,015,917 A | 1/2000 | Bhandari et al. |
| 6,117,692 A | 9/2000 | Kim et al. |
| 6,153,519 A | 11/2000 | Jain et al. |
| 6,174,809 B1 | 1/2001 | Kang et al. |
| 6,287,965 B1 | 9/2001 | Kang et al. |
| 6,351,036 B1 | 2/2002 | Stumborg et al. |
| 6,379,748 B1 | 4/2002 | Bhandari et al. |
| 6,391,785 B1 | 5/2002 | Satta et al. |
| 6,479,364 B2 | 11/2002 | Shin et al. |
| 6,511,539 B1 | 1/2003 | Raaijmakers |
| 6,527,855 B2 | 3/2003 | DelaRosa et al. |

(Continued)

FOREIGN PATENT DOCUMENTS

JP 63109172 5/1988

(Continued)

OTHER PUBLICATIONS

U.S. Appl. No. 11/214,533, filed Aug. 29, 2005, Vaartstra.

(Continued)

*Primary Examiner*—Asok K Sarkar
(74) *Attorney, Agent, or Firm*—Mueting, Raasch & Gebhardt, P.A.

(57) ABSTRACT

The present invention provides atomic layer deposition systems and methods that include at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group. Such systems and methods can be useful for depositing tantalum silicon nitride layers on substrates.

28 Claims, 2 Drawing Sheets

U.S. PATENT DOCUMENTS

| | | | |
|---|---|---|---|
| 6,534,395 | B2 | 3/2003 | Werkhoven et al. |
| 6,585,823 | B1 | 7/2003 | Van Wijck |
| 6,590,251 | B2 | 7/2003 | Kang et al. |
| 6,642,567 | B1 | 11/2003 | Marsh |
| 6,683,381 | B2 | 1/2004 | Harada |
| 6,703,708 | B2 | 3/2004 | Werkhoven et al. |
| 6,706,115 | B2 | 3/2004 | Leskelä et al. |
| 6,794,284 | B2 | 9/2004 | Vaartstra |
| 6,846,516 | B2 | 1/2005 | Yang et al. |
| 6,869,638 | B2 | 3/2005 | Baum et al. |
| 6,884,466 | B2 | 4/2005 | Kaloyeros et al. |
| 6,960,675 | B2 | 11/2005 | Chen et al. |
| 2002/0086111 | A1 | 7/2002 | Byun et al. |
| 2002/0175393 | A1 | 11/2002 | Baum et al. |
| 2003/0211736 | A1 | 11/2003 | Ludviksson et al. |
| 2004/0043149 | A1 | 3/2004 | Gordon et al. |
| 2004/0043151 | A1 | 3/2004 | Vaartstra |
| 2004/0043600 | A1 | 3/2004 | Vaartstra |
| 2004/0142555 | A1 | 7/2004 | Kamepalli et al. |
| 2005/0028733 | A1 | 2/2005 | Vaartstra |
| 2005/0032360 | A1 | 2/2005 | Vaartstra |
| 2005/0042888 | A1 | 2/2005 | Roeder et al. |
| 2005/0079290 | A1* | 4/2005 | Chen et al. .................. 427/250 |
| 2005/0202171 | A1* | 9/2005 | Shin ........................ 427/248.1 |

FOREIGN PATENT DOCUMENTS

| | | |
|---|---|---|
| JP | 03-183776 | 8/1991 |

OTHER PUBLICATIONS

U.S. Appl. No. 11/217,507, filed Sep. 1, 2005, Vaartstra.

Alén et al., "*Tert*-butylamine and allylamine as reductive nitrogen sources in atomic layer deposition of TaN thin films," *J. Mater. Res.*, 2002, Jan. 2002; 17(1):107-13.

Antiñolo et al., "Synthesis, Structural Characterisation and Reactivity of New Dinuclear Monocyclopentadienyl Imidoniobium and -tantalum Complexes—X-ray Crystal Structures of [{Nb($\eta^5$-C$_5$H$_4$SiMe$_3$)Cl$_2$}$_2$($\mu$-1,4-NC$_6$H$_4$N)], [{Ta($\eta^5$-C$_5$Me$_5$)Cl$_2$}$_2$($\mu$-1,4-NC$_6$H$_4$N)]and [{Ta($\eta^5$-C$_5$Me$_5$)(CH$_2$SiMe$_3$)$_2$}$_2$-($\mu$-1,4-NC$_6$H$_4$N)]," *Eur. J. Inorg. Chem.*, Mar. 2004;2004(6):1299-1310. Published online Feb. 10, 2004.

Aselage, "Preparation and Properties of Icosahedral Borides," *The Physics and Chemistry of Carbides; Nitrides and Borides*, R. Freer, ed., 1990, 185;97-111.

Bachmann et al., "Characterization and Properties of Artificially Grown Diamond," *Diamond and Diamond-Like Films and Coatings*, R.E. Clausing et al., eds., 1991; 266:677-713.

Badzian et al., "Graphite-Boron Nitride Solid Solutions by Chemical Vapor Desposition," *Proceedings of the 3$^{rd}$ International Conference on Chemical Vapor Deposition*, F.A. Glaski, ed. 1972; 747-53.

Bouteville et al., "LPCVD of Ta and Ti disilicides. TaCl$_2$ solid source—selectivity of TiSi$_2$ growth," *Proc. Eur. Conf. Chem. Vap. Deposition*, R. Porat, ed., Jerusalem, Israel, Mar. 29-Apr. 3, 1987; 6:264-9.

Chen et al., "Electrical Properties of the System: Boron-Nitrogen-Carbon," *Proceedings of the 3$^{rd}$ International Carbon Conference*, 1980; 44-7.

Chen et al., "Low-temperature chemical vapor deposition of tantalum nitride from tantalum pentabromide for integrated circuitry copper metallization applications," *J. Mater. Res.*, May 1999; 14(5): 2043-52.

Chen et al., "Low temperature plasma-assisted chemical vapor deposition of tantalum nitride from tantalum pentabromide for copper metallization," *J. Vac. Sci. Technol.*, Jan./Feb. 1999; *B* 17(1):182-5.

Cho et al., "Diffusion Barrier Properties of Metalorganic Chemical Vapor Deposited Tantalum Nitride Films Against Cu Metallization," *J. Electrochem. Soc.*, 1999; 146(10):3724-30.

Conde et al., "Influence of carbon content on the crystallographic structure of boron carbide films," *Surface and Coatings Technology*, 2000; 125:141-6.

Conde et al., "Boron carbide thin films prepared by CO$_2$ laser assisted chemical vapour deposition," *Protective Coatings and Thin Films: Synthesis, Characterization and Applications, ASI Series*, Y. Pauleau et al., eds., Dordrecht, The Netherlands, May 30-Jun. 5, 1996; title page, publication page, table of contents, 21:99-109.

Cullity, *Elements of X-Ray Diffraction, 2$^{nd}$ Edition*, 1978; cover page, publication page, table of contents only; 6 pgs.

Dekempeneer et al., "Tribological and structural properties of amorphous B—N—C coatings," *Surface and Coatings Technology*, 1996; 86-87:581-5.

Dinescu et al., "Boron carbon nitride films deposited by sequential pulses laser deposition," *Applied Surface Science*, 1998; 127-129:692-6.

Dubokiv et al., "High Temperature Boron Carbonitride Based Ceramics," *Journal of the Less-Common Metals*, 1986; 117:265-9.

Emin, "Icosahedral boron-rich solids," *Physics Today*, Jan. 1987 40(1):55-62.

Hara et al., "Barrier Properties for Oxygen Diffusion in a TaSiN Layer," *Jpn. J. Appl.-Phys.*, 1997; 36(7B), L893-L895.

Hawley, *The Condensed Chemical Dictionary*, 10$^{th}$ Edition, Van Nostrand Reinhold Co., New York, 1981; 225-226.

Hieber et al., "Possible Applications of Tantalum Silicide For Very-Large-Scale Integration Techology," *Thin Solid Films*, 1986; 140:131-5.

X-ray Photoelectron Spectroscopy (XPS) Database, Version 3.0 (Web Version), [onlne]. [retrieved Nov. 26, 2002]. Retrieved from the Internet: <http://srdata.nist.gov/xps/>. 1 page.

NIST WebBook, [online]. [retrieved Dec. 12, 2002]. Retrieved from the Internet: <http://webbook.nist.gov/>. 2 pages.

Kaner et al., "Boron-Carbon-Nitrogen Materials of Graphite-Like Structure," *Materials Research Bulletin*, 1987; 22:399-404.

Kawaguchi, "B/C/N Materials Based on the Graphite Network," *Advanced Materials*, 1997; 9(8):615-25.

Knotek et al., "Mechanical and Tribological Properties of Thin Films Produced by Sputtering Within the B—N—C Triangle," *Hard Coatings Based on Borides, Carbides and Nitrides*, A. Kumar et al., eds., Warrendale, Pennsylvania, title page, table of contents, 1998; 169-78.

Kolawa et al., "Tantalum-based diffusion barriers in Si/Cu VLSI metallizations," *J. Appl. Phys.*, Aug. 1, 1991; 70(3):1369-73.

Lee et al., "Structural and chemical stability of Ta—Si—N thin film between Si and Cu," *Thin Solid Films*, 1998; 320:141-6.

Moore et al., "Properties and characterization of codeposited boron nitride and carbon materials," *Journal of Applied Physics*, Jun. 15, 1989; 65(12):5109-118.

Newport et al., "The dual source APCVD of titanium nitride thin films from reaction of hexamethyldisilazane and titanium tetrachloride," *J. Mater. Chem.*, 2002; 12:1906-9.

Oliveira et al., "Deposition of boron carbide by laser CVD: a comparison with thermodynamic predictions," *Solid Thin Films*, 1997; 307:29-37.

Oliveira et al., "Synthesis and properties of B$_x$C$_y$N$_z$ coatings," *J. Mater. Res.*, 2001; 16(3):734-43.

Oliveira et al., "XPS investigatino of B$_x$C$_y$N$_z$ coatings deposited by laser assisted chemical vapour desposition," *Surface & Coatings Tehcnology*, 1998, 100-101:398-403.

Redlich et al., "B—C—N nanotubes and boron doping of carbon nanotubes," *Chemical Physics Letters*, Sep. 27, 1996; 260:465-70.

"Refractory metal, "*Webster's New Universal Unabridged Dictionary*, Avenel, New Jersey, 1992; p. 1207.

Reynolds,"Low pressure chemical vapor deposition of tantalum silicide," Presentation Abstract, *Proc. Electrochem. Soc.*, Palo Alto, CA, USA, 1987.

Reynolds, "Low pressure chemical vapor deposition of tantalum silicide," *J. Electrochem. Soc.*, Jun. 1988; 135(6):1483-90.

Saugnac et al., "Characterization of C—B—N Solid Solutions Deposited from a Gaseous Phase between 900° and 1050° C," *Journal of the American Ceramic Society*, Jan. 1992; 75 (1):161-9.

Shimanouchi, *Tables of Molecular Vibrational Frequencies Consolidated* vol. 1; Tokyo, Japan, 1972; title page, foreward, table of contents, p. 1, abstract; 6 pages total.

Szörényi et al., "Chemical analysis of a-CN$_x$ thin films synthesized by nanosecond and fetosecond pulsed laser deposition," *Applied Physics A*, 1999; 69[Suppl]:S941-S944.

Tallant et al., "Boron carbide structure by Raman spectroscopy," *Physical Review B*, Sep. 15, 1989; 40(8):5649-56.

Telle, "Chapter 4—Boride and Carbide Ceramics Materials," *Science and Technology*, vol. 11:*Structure and Properties of Ceramics*, M. Swain, ed., New York, New York, 1994; cover page, title page, publication page, table of contents; 11:173-266.

Tsai et al, "Metalorganic chemical vapor deposition of tantalum nitride by terbutylimidotris (diethyalmido) tantalum for advanced metallization," *Appl. Phys. Lett.*, Aug. 21, 1995; 67(8):1128-30.

Ulrich et al., "Phase separation in magnetron sputtered superhard BCN thin films," *Diamond and Related Materials*, 1998; 7:839-44.

Vehkamäki et al., "Growth of SrTiO$_3$ and BaTiO$_3$ Thin Films by Atomic Layer Deposition," *Electrochemical and Solid-State Letters*, 1999; 2(10):504-6.

Wallace et al., "Identifying the Most Promising High-k Gate Dielectrics," *Semiconductor International*, Jul. 2001; pp. 227-228, 230, 232, 234, 236.

Warren, *X-Ray Diffraction*, Mineola, New York, 1990, cover page, publication page, table of contents, 5 pages total.

Weber et al., "Growth of cubic boron nitride and boron-carbon-nitrogen coatings using *N*-trimethylborazine in an electron cyclotron resonance plasma process," *Diamond and Related Materials*, 1993; 2:201-6.

Weiller et al., "Effect of Dimethylamine on the Chemical Vapor Deposition of TiN from Tetrakis(dimethylamido)titanium and Ammonia," *J. Electrochem. Soc.*, Mar. 1997; 144(3): L40-L43.

Widmer et al., "The growth and physical properties of low pressure chemically vapour-deposited films of tantalum silicide on n$^+$-type polycrystalline silicon," *Thin Solid Films*, 1986; 138(1):131-40.

Williams et al., "Low pressure chemical vapor deposition of tantalum silicide," *J. Electrochem. Soc.*, 1986; 133(12):2637-44.

Winter et al., "A Single-Source Precursor to Titanium Nitride Thin Films. Evidence for the Intermedicacy of Imido Complexes in the Chemical Vapor Deposition Process," *J. Am. Chem. Soc.*, 1992; 114:1095-97.

Winter, "The Chemical Vapor Deposition of Metal Nitride Films Using Modern Metalorganic Precursors," *Aldrichimica Acta*, 2000; 33(1):3-12.

Ya Kosolapova et al., *Poroshkovaia Metallurgiia*, 1971; 1(97):27-33. (English Language Summary).

\* cited by examiner

ATOMIC LAYER DEPOSITION SYSTEMS AND METHODS INCLUDING SILICON-CONTAINING TANTALUM PRECURSOR COMPOUNDS

FIELD OF THE INVENTION

This invention relates to methods of forming tanatalum layers containing silicon and nitrogen (tantalum silicon nitride layers) on a substrate using a tantalum precursor compound containing both nitrogen and silicon in a multi-step atomic layer deposition process. The formed tantalum silicon nitride layers are particularly useful as diffusion barrier layers for polysilicon substrates to reduce diffusion of, for example, oxygen, copper, or silicon.

BACKGROUND

In very-large-scale integration (VLSI) technology, tantalum silicide has been proposed to be useful in a variety of applications. These include: policide gate metallization (i.e., the use of tantalum silicide in combination with a doped polycrystalline silicon (poly-Si) underlayer as a low resistive gate metallization layer); silicide gate (i.e., the use of tantalum silicide as a directly deposited layer on a gate oxide to reduce sheet resistance); source-drain silicidation (i.e., the use of tantalum silicide in the silicidation of contacts thereby providing in low resistive contacts); and diffusion barrier (i.e., the use of tantalum silicide a diffusion barrier between an Al—Si—Ti layer and silicon thereby providing reliable and low resistive contacts to n+ and p+ Si). Tantalum silicon nitride (Ta—Si—N) has also been shown to form a useful conductive barrier layer between silicon substrates and copper interconnects to reduce copper diffusion.

Amorphous ultra-thin (i.e., less than 100 Å) tantalum-silicon-nitrogen barrier films have been disclosed for use between silicon and copper interconnection materials in integrated circuits. These barrier films suppress the diffusion of copper into silicon, thus improving device reliability. Physical vapor deposition (PVD) methods, such as reactive sputtering, have been disclosed to form noncrystalline, low resistivity Ta—Si—N layers that acts as a barrier to oxygen diffusion during high temperature annealing at 650° C. in the presence of $O_2$. The Ta—Si—N layers are formed by using radio-frequency reactive sputtering with pure Ta and Si targets on a 100 nm thick polysilicon layer. Layers having relatively low silicon content, such as $Ta_{0.50}Si_{0.16}N_{0.34}$, have been disclosed to have a desirable combination of good diffusion barrier resistance along with low sheet resistance. These Ta—Si—N barrier layers have improved peel resistance over Ta—N barrier layers during annealing conditions.

However, when PVD methods are used, the stoichiometric composition of the formed metal silicon nitride barrier layers such as Ta—Si—N can be non-uniform across the substrate surface due to different sputter yields of Ta, Si, and N. Further, PVD methods yield films with poor conformality on structured surfaces, even when a single source is used. Due to the resulting poor layer conformality, defects such as pinholes often occur in such layers creating pathways to diffusion. As a result, the effectiveness of a physically deposited diffusion barrier layer is dependent on the layer being sufficiently thick. Moreover, sufficiently thick layers may not even be obtainable on surfaces having sufficiently deep structures.

Vapor deposition processes are preferable to PVD processes in order to achieve the most efficient and uniform barrier layer coverage of substrate surfaces. There remains a need for vapor deposition processes, particularly atomic layer deposition processes, to form tantalum silicon nitride barrier layers on substrates, such as semiconductor substrates or substrate assemblies.

SUMMARY OF THE INVENTION

An atomic layer deposition method for preparing tantalum silicon nitride layers is a continuing need in the art. For example, it has been surprisingly found that while an atomic layer deposition method using alternating doses of tantalum-containing precursor (e.g., tert-butylimino-tris(diethylamido) tantalum, hereinafter "TBTDET") and $NH_3$ formed a tantalum nitride film, little or no tantalum nitride-containing film was observed when doses of a silicon-containing precursor (e.g., $Si_2H_6$) were additionally included in the method. Thus, the use of silicon-containing precursors in an atomic layer deposition method was observed to inhibit the formation of tantalum nitride-containing (e.g., tantalum silicon nitride) films.

In one aspect, the present invention provides a method of forming a metal-containing layer on a substrate. The method includes: providing a substrate; providing a vapor including at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group; and contacting the vapor including the at least one compound of Formula I with the substrate to form a tantalum silicon nitride layer on at least one surface of the substrate using an atomic layer deposition process including a plurality of deposition cycles. Typically, the method further includes providing at least one reaction gas. Atomic layer deposition systems including at least one compound of the formula (Formula I) are also provided.

In another aspect, the present invention provides a methods of manufacturing a semiconductor structure. The method includes: providing a semiconductor substrate or substrate assembly; providing a vapor including at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group; and directing the vapor including the at least one compound of Formula I to the semiconductor substrate or substrate assembly to form a tantalum silicon nitride layer on at least one surface of the semiconductor substrate or substrate assembly using an atomic layer deposition process including a plurality of deposition cycles. Optionally, the method further includes providing a vapor including at least one metal-containing compound different than Formula I, and directing the vapor including the at least one metal-containing compound different than Formula I to the substrate.

In another aspect, the present invention provides a method of manufacturing a semiconductor structure. The method includes: providing a semiconductor substrate or substrate assembly within an atomic layer deposition chamber; providing a vapor including at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group; directing the vapor including the at least one compound of Formula I to the semiconductor substrate or substrate assembly and allowing the at least one compound to chemisorb to at least one surface of the semiconductor substrate or substrate assembly to form a tantalum silicon nitride layer on at least one surface of the semiconductor substrate or substrate assembly. Typically, the method further includes providing at least one reaction gas and directing the reaction gas to the semiconductor substrate or substrate assembly.

In another aspect, the present invention provides a method of manufacturing a memory device structure. The method includes: providing a substrate including a silicon-containing surface; providing a vapor including at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group; contacting the vapor including the at least one compound of Formula I with the substrate to chemisorb the compound on the silicon-containing surface of the substrate; providing at least one reaction gas; contacting the at least one reaction gas with the substrate having the chemisorbed compound thereon to form a tantalum silicon nitride barrier layer on the silicon-containing surface of the substrate; providing a first electrode on the barrier layer; providing a high dielectric material on at least a portion of the first electrode; and providing a second electrode on the high dielectric material.

Definitions

As used herein, "metal-containing" is used to refer to a material, typically a compound or a layer, that may consist entirely of a metal, or may include other elements in addition to a metal. Typical metal-containing compounds include, but are not limited to, metals, metal-ligand complexes, metal salts, metal-organic compounds, and combinations thereof. Typical metal-containing layers include, but are not limited to, metals, metal oxides, metal silicates, metal silicides, metal nitrides, and combinations thereof.

As used herein, "a," "an," "the," and "at least one" are used interchangeably and mean one or more than one.

The terms "deposition process" and "vapor deposition process" as used herein refer to a process in which a metal-containing layer is formed on one or more surfaces of a substrate (e.g., a doped polysilicon wafer) from vaporized precursor composition(s) including one or more metal-containing compounds(s). Specifically, one or more metal-containing compounds are vaporized and directed to and/or contacted with one or more surfaces of a substrate (e.g., semiconductor substrate or substrate assembly) placed in a deposition chamber. Typically, the substrate is heated. These metal-containing compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

The term "atomic layer deposition" (ALD) as used herein refers to a vapor deposition process in which deposition cycles, preferably a plurality of consecutive deposition cycles, are conducted in a process chamber (i.e., a deposition chamber). Typically, during each cycle the precursor is chemisorbed to a deposition surface (e.g., a substrate assembly surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor composition(s), reactive gas, and purge (e.g., inert carrier) gas.

As compared to the one cycle chemical vapor deposition (CVD) process, the longer duration multi-cycle ALD process allows for improved control of layer thickness and composition by self-limiting layer growth, and minimizing detrimental gas phase reactions by separation of the reaction components. The self-limiting nature of ALD provides a method of depositing a film on any suitable reactive surface, including surfaces with irregular topographies, with better step coverage than is available with CVD or other "line of sight" deposition methods such as evaporation or physical vapor deposition (PVD or sputtering).

DETAILED DESCRIPTION OF CERTAIN EMBODIMENTS

Figure 1:
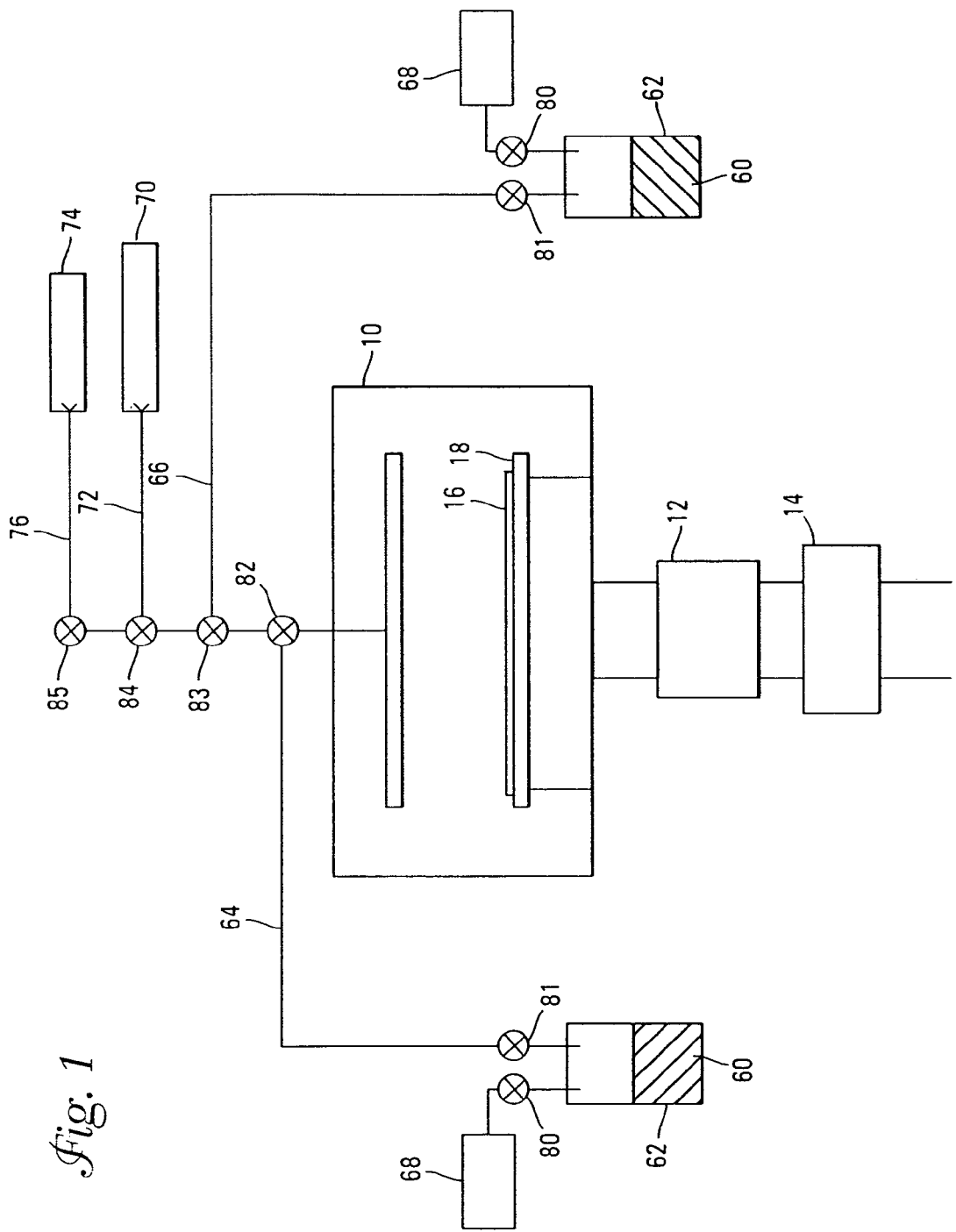
FIG. 1 is a perspective view of a vapor deposition system suitable for use in methods of the present invention.

The present invention provides methods and systems for forming a tantalum-containing layer (e.g., a barrier layer, preferably a conductive barrier layer) on a substrate (i.e., a silicon containing or a non-silicon containing substrate) using a silicon-containing and nitrogen-containing tantalum precursor compound in an atomic layer deposition method. The tantalum-containing layer is a tantalum silicon nitride layer that, in some embodiments, is formed from the tantalum-containing precursor without using additional silicon-containing or nitrogen-containing precursors.

The layers of the present invention are preferably conductive. That is, they preferably display an electrical resistivity of no more than about 10 mΩ-cm. The layers of the present invention are typically useful as barrier layers, particularly in the manufacture of semiconductor interconnects. For example, tantalum silicon nitride makes ohmic contact to silicon and is not only a good barrier for tungsten, aluminum, and copper interconnects, but might also have possible application for high dielectric constant barriers or electrodes. Other applications for the layers of the present invention include polycide gate metallization and gate electrodes. Composites containing tantalum silicon nitride are also of interest as wide bandpass optical elements.

The layers or films formed can be in the form of tantalum silicon nitride-containing films, wherein the layer includes tantalum silicon nitride optionally doped with other metals. Thus, the term "tantalum silicon nitride" films or layers encompass tantalum silicon nitrides (typically $Ta_xSi_yN_z$ of all possible proportions of Ta, Si, and N), as well as doped films or layers thereof (e.g., mixed metal silicon nitrides). Such mixed metal species can be formed using one or more metal-containing precursor compounds of a formula different from Formula I, which can be readily determined by one of skill in the art.

The methods include providing a vapor of at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group. Preferably each $R^1$, $R^2$, and $R^3$ is independently hydrogen or an organic group having 1 to 10 carbon atoms. Exemplary R groups (and preferably moieties) include, for example, hydrogen, methyl, ethyl, propyl, isopropyl, butyl, sec-butyl, isobutyl, tert-butyl, and the like.

Preferred silicon-containing organic groups are groups having the formula —$SiR^4R^5R^6$, wherein each $R^4$, $R^5$, and R is independently hydrogen or an organic group, typically having from 1 to 10 carbon atoms. Preferably each $R^4$, $R^5$, and $R^6$ is independently an aliphatic group, typically having from 1 to 10 carbon atoms. Exemplary silicon-containing R groups include, but are not limited to, —$SiH_3$, —$SiH_2(CH_3)$, —$SiH(CH_3)_2$, —$Si(CH_3)_3$, —$Si(CH_3)_2(CH_2CH_3)$, —$Si(CH_3)(CH_2CH_3)_2$, —$Si(CH_2CH_3)_3$, —$Si(CH_2CH_2CH_2CH_3)_3$, —$CH_2Si(CH_3)_3$, —$CH_2CH_2Si(CH_3)_3$, and the like.

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for metal-containing compounds of this invention are those that do not interfere with the formation of a tantalum silicon nitride layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl (Me), ethyl (Et), n-propyl (n-Pr), isopropyl, tert-butyl (t-Bu), amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, tert-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, tert-butyl, and the like.

The silicon content of the precursor compound of the formula (Formula I) $Ta(NR^1)(NR^2R^3)_3$, can varied by selecting one or more of $R^1$, $R^2$, and $R^3$ to be a silicon-containing organic group. A wide variety of compounds of the formula (Formula I) can be used in methods of the present invention including, for example, one or more of $Ta(NH)(NH_2)_2(NH(SiMe_3))$, $Ta(NMe)(NMe_2)_2(N(Me)(SiMe_3))$, $Ta(NSiMe_3)(NMe_2)_3$, $Ta(NBu)(NEt_2)_2(N(Et)(SiMe_3))$, $Ta(NMe)(NMe_2)_2(N(SiMe_3)_2)$, $Ta(NEt)(NEt_2)_2(N(SiMe_3)_2)$, $Ta(NEt)(NEt_2)(N(Et)(SiMe_3))_2$, $Ta(NSiMe_3)(NEt_2)_2(N(Et)(SiMe_3))$, $Ta(NEt)(N(Et)(SiMe_3))_3$, $Ta(N(SiMe_3)(N(Et)(SiMe_3))_3$, $Ta(N(SiMe_3))(N(SiMe_3)_2)_3$, and the like. Thus, the silicon content of the precursor compound of the formula (Formula I) can be selected to provide a tantalum silicon nitride film having a useful or desired silicon content.

Precursor compositions that include at least one compound of the formula (Formula I) can be useful for depositing metal-containing layers using atomic layer deposition. In addition, such atomic layer deposition methods can also include precursor compositions that include one or more different metal-containing compounds. Such precursor compositions can be deposited/chemisorbed, for example in an ALD process discussed more fully below, substantially simultaneously with or sequentially to, the precursor compositions including at least one compound of the formula (Formula I). The metals of such different metal-containing compounds can include, for example, Ti, Ta, W, and combinations thereof. Suitable different metal-containing compounds include, for example, titanium tetrachloride, trichlorotitanium dialkylamides, tetrakis titanium dialkylamides, pentakis tantalum ethoxide, tungsten hexafluoride, tungsten hexacarbonyl, bis(tert-butylimido)bis(dimethylamido)tungsten, bis(tert-butylimido)bis(tert-butylamido)tungsten, various other imido tungsten complexes (e.g., isopropylimido tungsten complexes such as $Cl_4(RCN)W(N^iPr)$, wherein R is methyl or phenyl), and combinations thereof.

The metal-containing layer can be deposited, for example, on a substrate (e.g., a semiconductor substrate or substrate assembly). "Substrate" as used herein refers to any base material or construction upon which a layer can be deposited. The term "substrate" is meant to include semiconductor substrates and also include non-semiconductor substrates such as films, molded articles, fibers, wires, glass, ceramics, machined metal parts, etc. "Semiconductor substrate" or "substrate assembly" as used herein refers to a semiconductor substrate such as a metal electrode, base semiconductor layer, or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

"Layer," as used herein, refers to any layer that can be formed on a substrate from one or more precursors and/or reactants according to the deposition process described herein. The term "layer" is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed directly on the lowest semiconductor surface of the substrate, or they can be formed on any of a variety of layers (e.g., surfaces) as in, for example, a patterned wafer.

"Barrier layer" as used herein refers to a conductive, interfacial layer that can reduce diffusion of ambient oxygen through a dielectric layer into a semiconductor substrate (typically a polysilicon substrate) or can reduce diffusion of one layer into another, such as a copper conductive layer into a semiconductor substrate (typically a polysilicon substrate). Methods for making tantalum silicon nitride layers for use are barrier layers are disclosed herein.

The tantalum silicon nitride layers or films formed may include a single metal or two or more different metals. In some embodiments, the tantalum silicon nitride layers or films may optionally be doped with other metals. If the layer includes two or more different metals, the layer can be in the form of alloys, solid solutions, or nanolaminates. Preferably, the tantalum silicon nitride layer has barrier properties. More preferably, the tantalum silicon nitride layer is a conductive barrier layer.

Various metal-containing compounds can be used in various combinations, optionally with one or more organic solvents (particularly for CVD processes), to form a precursor composition. Advantageously, some of the metal compounds disclosed herein can be used in ALD without adding solvents. "Precursor" and "precursor composition" as used herein, refer to a composition usable for forming, either alone or with other precursor compositions (or reactants), a layer on a substrate assembly in a deposition process. Further, one skilled in the art will recognize that the type and amount of precursor used will depend on the content of a layer which is ultimately to be formed using a vapor deposition process. The preferred precursor compositions of the present invention are preferably liquid at the vaporization temperature and, more preferably, are preferably liquid at room temperature.

The precursor compositions may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc.

Herein, vaporized metal-containing compounds may be used either alone or optionally with vaporized molecules of other metal-containing compounds or optionally with vaporized solvent molecules or inert gas molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

"Inert gas" or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes described according to the present invention, and in some embodiments may also be used to assist in precursor vapor transport.

Solvents that are suitable for certain embodiments of the present invention may be one or more of the following: aliphatic hydrocarbons or unsaturated hydrocarbons (C3-C20, and preferably C5-C10, cyclic, branched, or linear), aromatic hydrocarbons (C5-C20, and preferably C5-C10), halogenated hydrocarbons, silylated hydrocarbons such as alkylsilanes, alkylsilicates, ethers, polyethers, thioethers, esters, lactones, nitrites, silicone oils, or compounds containing combinations of any of the above or mixtures of one or more of the above. The compounds are also generally compatible with each other, so that mixtures of variable quantities of the metal-containing compounds will not interact to significantly change their physical properties.

The precursor compositions of the present invention can, optionally, be vaporized and deposited/chemisorbed substantially simultaneously with, and in the presence of, one or more reaction gases. Alternatively, the metal-containing layers may be formed by alternately introducing the precursor composition and the reaction gas(es) during each deposition cycle. Such reaction gases may typically include hydrogen, hydrogen sulfide, hydrogen selenide, hydrogen telluride, carbon monoxide, ammonia, organic amines, hydrazines (e.g., hydrazine, methylhydrazine, symmetrical and unsymmetrical dimethylhydrazines), silanes, disilanes and higher silanes, diborane, plasma (e.g., $H_2$ plasma), borazene (nitrogen source), carbon monoxide (reductant), and any combination of these gases. Preferable optional reaction gases used in the formation of tantalum silicon nitride layers include $NH_3$ and CO.

Suitable substrate materials of the present invention include conductive materials, semiconductive materials, conductive metal-nitrides, conductive metals, conductive metal oxides, etc. The substrate on which the metal-containing layer is formed is preferably a semiconductor substrate or substrate assembly. Any suitable semiconductor material is contemplated, such as for example, borophosphosilicate glass (BPSG), silicon such as, e.g., conductively doped polysilicon, monocrystalline silicon, etc. (for this invention, appropriate forms of silicon are simply referred to as "silicon"), for example in the form of a silicon wafer, tetraethylorthosilicate (TEOS) oxide, spin on glass (i.e., a thin layer of $SiO_2$, optionally doped, deposited by a spin on process), TiN, TaN, W, Ru, Al, Cu, noble metals, etc. A substrate assembly may also contain a layer that includes platinum, iridium, iridium oxide, rhodium, rhodium oxide, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, the layers can be formed directly on the lowest semiconductor surface of the substrate, or they can be formed on any of a variety of the layers (i.e., surfaces) as in a patterned wafer, for example.

Substrates other than semiconductor substrates or substrate assemblies can also be used in methods of the present invention. Any substrate that may advantageously form a metal-containing layer thereon, such as a tantalum silicon nitride layer, may be used, such substrates including, for example, fibers, wires, etc.

The precursor compositions can be vaporized in the presence of an inert carrier gas if desired. Additionally, an inert carrier gas can be used in purging steps in an ALD process (discussed below). The inert carrier gas is typically one or more of nitrogen, helium, argon, etc. In the context of the present invention, an inert carrier gas is one that does not interfere with the formation of the metal-containing layer. Whether done in the presence of a inert carrier gas or not, the vaporization is preferably done in the absence of oxygen to avoid oxygen contamination of the layer (e.g., oxidation of silicon to form silicon dioxide or oxidation of precursor in the vapor phase prior to entry into the deposition chamber).

Chemical vapor deposition (CVD) and atomic layer deposition (ALD) are two vapor deposition processes often employed to form thin, continuous, uniform, metal-containing layers onto semiconductor substrates. Using either vapor deposition process, typically one or more precursor compositions are vaporized in a deposition chamber and optionally combined with one or more reaction gases and directed to and/or contacted with the substrate to form a metal-containing layer on the substrate. It will be readily apparent to one skilled in the art that the vapor deposition process may be enhanced by employing various related techniques such as plasma assistance, photo assistance, laser assistance, as well as other techniques.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Preferably, the vapor deposition process employed in the methods of the present invention is a multi-cycle atomic layer deposition (ALD) process. Such a process is advantageous, in particular advantageous over a CVD process, in that it provides for improved control of atomic-level thickness and uniformity to the deposited layer (e.g., barrier layer) by providing a plurality of self-limiting deposition cycles. The self-limiting nature of ALD provides a method of depositing a film on any suitable reactive surface including, for example, surfaces with irregular topographies, with better step coverage than is available with CVD or other "line of sight" deposition methods (e.g., evaporation and physical vapor deposition, i.e., PVD or sputtering). Further, ALD processes typically expose the metal-containing compounds to lower volatilization and reaction temperatures, which tends to decrease degradation of the precursor as compared to, for example, typical CVD processes.

Generally, in an ALD process each reactant is pulsed sequentially onto a suitable substrate, typically at deposition temperatures of at least 25° C., preferably at least 150° C., and more preferably at least 200° C. Typical ALD deposition temperatures are no greater than 400° C., preferably no greater than 350° C., and even more preferably no greater than 250° C. These temperatures are generally lower than those presently used in CVD processes, which typically include deposition temperatures at the substrate surface of at least 150° C., preferably at least 200° C., and more preferably at least 250° C. Typical CVD deposition temperatures are no greater than 600° C., preferably no greater than 500° C., and even more preferably no greater than 400° C.

Under such conditions the film growth by ALD is typically self-limiting (i.e., when the reactive sites on a surface are used up in an ALD process, the deposition generally stops), insuring not only excellent conformality but also good large area uniformity plus simple and accurate composition and thickness control. Due to alternate dosing of the precursor compositions and/or reaction gases, detrimental vapor-phase reactions are inherently eliminated, in contrast to the CVD process that is carried out by continuous co-reaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10): 504-506 (1999)).

A typical ALD process includes exposing a substrate (which may optionally be pretreated with, for example, ammonia or chlorine/UV irradiation) to a first chemical to accomplish chemisorption of the species onto the substrate. The term "chemisorption" as used herein refers to the chemical adsorption of vaporized reactive metal-containing compounds on the surface of a substrate. The adsorbed species are typically irreversibly bound to the substrate surface as a result of relatively strong binding forces characterized by high adsorption energies (e.g., >30 kcal/mol), comparable in strength to ordinary chemical bonds. The chemisorbed species typically form a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compositions or reaction gases are alternately introduced (e.g., pulsed) into a deposition chamber and chemisorbed onto the surfaces of a substrate. Each sequential introduction of a reactive compound (e.g., one or more precursor compositions and one or more reaction gases) is typically separated by an inert carrier gas purge. Each precursor composition co-reaction adds a new atomic layer to previously deposited layers to form a cumulative solid layer. The cycle is repeated to gradually form the desired layer thickness. It should be understood that ALD can alternately utilize one precursor composition, which is chemisorbed, and one reaction gas, which reacts with the chemisorbed species.

Practically, chemisorption might not occur on all portions of the deposition surface (e.g., previously deposited ALD material). Nevertheless, such imperfect monolayer is still considered a monolayer in the context of the present invention. In many applications, merely a substantially saturated monolayer may be suitable. In one aspect, a substantially saturated monolayer is one that will still yield a deposited monolayer or less of material exhibiting the desired quality and/or properties. In another aspect, a substantially saturated monolayer is one that is self-limited to further reaction with precursor.

A typical ALD process includes exposing an initial substrate to a first chemical species A (e.g., a metal-containing compound as described herein) to accomplish chemisorption of the species onto the substrate. Species A can react either with the substrate surface or with Species B (described below), but not with itself. Typically in chemisorption, one or more of the ligands of Species A is displaced by reactive groups on the substrate surface. Theoretically, the chemisorption forms a monolayer of adsorbed precursor that is uniformly one molecule thick on the entire exposed initial substrate, the monolayer being composed of Species A, less any displaced ligands. In other words, a saturated monolayer is substantially formed on the substrate surface. Practically, chemisorption may not occur on all portions of the substrate. Nevertheless, such a partial monolayer is still understood to be a monolayer in the context of the present invention. In many applications, merely a substantially saturated monolayer may be suitable. A substantially saturated monolayer is one that will still yield a deposited layer exhibiting the quality and/or properties desired for such layer.

The first species (e.g., substantially all non-chemisorbed molecules of Species A) as well as displaced ligands are purged from over the substrate and a second chemical species, Species B (e.g., a different metal-containing compound or reactant gas) is provided to react with the monolayer of Species A. Species B typically displaces the remaining ligands from the Species A monolayer and thereby is chemisorbed and forms a second layer. This second layer displays a surface which is reactive only to Species A. Non-chemisorbed Species B, as well as displaced ligands and other byproducts of the reaction are then purged and the steps are repeated with exposure of the Species B layer to vaporized Species A. Optionally, the second species can react with the first species, but not chemisorb additional material thereto. That is, the second species can cleave some portion of the chemisorbed first species, altering such layer without forming another layer thereon, but leaving reactive sites available for formation of subsequent layers. In other ALD processes, a third species or more may be successively chemisorbed (or reacted) and purged just as described for the first and second species, with the understanding that each introduced species reacts with the layer produced immediately prior to its introduction. Optionally, the second species (or third or subsequent) can include at least one reaction gas if desired.

Thus, the use of ALD provides the ability to improve the control of thickness, composition, and uniformity of metal-containing layers on a substrate. For example, depositing thin layers of metal-containing compound in a plurality of cycles provides a more accurate control of ultimate film thickness. This is particularly advantageous when the precursor composition is directed to the substrate and allowed to chemisorb thereon, preferably further including at least one reaction gas that reacts with the chemisorbed species on the substrate, and even more preferably wherein this cycle is repeated at least once.

Purging of excess vapor of each species following deposition/chemisorption onto a substrate may involve a variety of techniques including, but not limited to, contacting the substrate and/or monolayer with an inert carrier gas and/or lowering pressure to below the deposition pressure to reduce the concentration of a species contacting the substrate and/or chemisorbed species. Examples of carrier gases, as discussed above, may include $N_2$, Ar, He, etc. Additionally, purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only react with the surface created from the chemisorption of the first species and thus, may also be self-limiting. Once all of the finite number of sites on a substrate are bonded with a first species, the first species will not bond to other of the first species already bonded with the substrate. However, process conditions can be varied in ALD to promote such bonding and render ALD not self-limiting, e.g., more like pulsed CVD. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is 0.2 to 3.0 Angstroms per cycle), until a layer of the desired thickness is built up on the substrate of interest. The layer deposition is accomplished by alternately introducing (i.e., by pulsing) precursor composition(s) into the deposition chamber containing a substrate, chemisorbing the precursor composition(s) as a monolayer onto the substrate surfaces, purging the deposition chamber, then introducing to the chemisorbed precursor composition(s) reaction gases and/or other precursor composition(s) in a plurality of deposition cycles until the desired thickness of the metal-containing layer is achieved. Preferred thicknesses of the metal-containing layers of the present invention are at least 1 angstrom (Å), more preferably at least 5 Å, and more preferably at least 10 Å. Additionally, preferred film thicknesses are typically no greater than 500 Å, more preferably no greater than 400 Å, and more preferably no greater than 300 Å.

The pulse duration of precursor composition(s) and inert carrier gas(es) is generally of a duration sufficient to saturate the substrate surface. Typically, the pulse duration is at least 0.1, preferably at least 0.2 second, and more preferably at least 0.5 second. Preferred pulse durations are generally no greater than 300 seconds, and preferably no greater than 60 seconds.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed precursor composition(s) and the underlying substrate surface and to prevent decomposition of the precursor composition(s). The temperature, on the other hand, must be sufficiently high to avoid condensation of the precursor composition(s). Typically the substrate is kept at a temperature of at least 25° C., preferably at least 150° C., and more preferably at least 200° C. Typically the substrate is kept at a temperature of no greater than 400° C., preferably no greater than 300° C., and more preferably no greater than 250° C., which, as discussed above, is generally lower than temperatures presently used in typical CVD processes. Thus, the first species or precursor composition is chemisorbed at this temperature. Surface reaction of the second species or precursor composition can occur at substantially the same temperature as chemisorption of the first precursor or, optionally but less preferably, at a substantially different temperature. Clearly, some small variation in temperature, as judged by those of ordinary skill, can occur but still be considered substantially the same temperature by providing a reaction rate statistically the same as would occur at the temperature of the first precursor chemisorption. Alternatively, chemisorption and subsequent reactions could instead occur at substantially exactly the same temperature.

For a typical vapor deposition process, the pressure inside the deposition chamber is at least $10^{-8}$ torr ($1.3 \times 10^{-6}$ Pa), in certain embodiments at least $10^{-7}$ torr ($1.3 \times 10^{-5}$ Pa), and in other embodiments at least $10^{-6}$ torr ($1.3 \times 10^{-4}$ Pa) or even greater. Further, deposition pressures are typically no greater than 10 torr ($1.3 \times 10^3$ Pa), in some embodiments no greater than 1 torr ($1.3 \times 10^2$ Pa), and in other embodiments no greater than $10^{-1}$ torr (13 Pa) or even less. Typically, the deposition chamber is purged with an inert carrier gas after the vaporized precursor composition(s) have been introduced into the chamber and/or reacted for each cycle. The inert carrier gas/gases can also be introduced with the vaporized precursor composition(s) during each cycle.

The reactivity of a precursor composition can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process may be optionally performed in situ in the deposition chamber in a reducing, inert, or plasma atmosphere. Preferably, the annealing temperature is at least 400° C., more preferably at least 600° C. The annealing temperature is preferably no greater than 1000° C., more preferably no greater than 750° C., and even more preferably no greater than 700° C.

The annealing operation is preferably performed for a time period of at least 0.5 minute, more preferably for a time period of at least 1 minute. Additionally, the annealing operation is preferably performed for a time period of no greater than 60 minutes, and more preferably for a time period of no greater than 10 minutes.

One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using barrier materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A system that can be used to perform an atomic layer deposition processes of the present invention is shown in FIG. 1. The system includes an enclosed vapor deposition chamber 10, in which a vacuum may be created using turbo pump 12 and backing pump 14. One or more substrates 16 (e.g., semiconductor substrates or substrate assemblies) are positioned in chamber 10. A constant nominal temperature is established for substrate 16, which can vary depending on the process used. Substrate 16 may be heated, for example, by an electrical resistance heater 18 on which substrate 16 is mounted. Other known methods of heating the substrate may also be utilized.

In this process, precursor composition(s) as described herein, 60 and/or 61, are stored in vessels 62. The precursor composition(s) are vaporized and separately fed along lines 64 and 66 to the deposition chamber 10 using, for example, an inert carrier gas 68. A reaction gas 70 may be supplied along line 72 as needed. Also, a purge gas 74, which is often the same as the inert carrier gas 68, may be supplied along line 76 as needed. As shown, a series of valves 80-85 are opened and closed as required.

Figure 2:
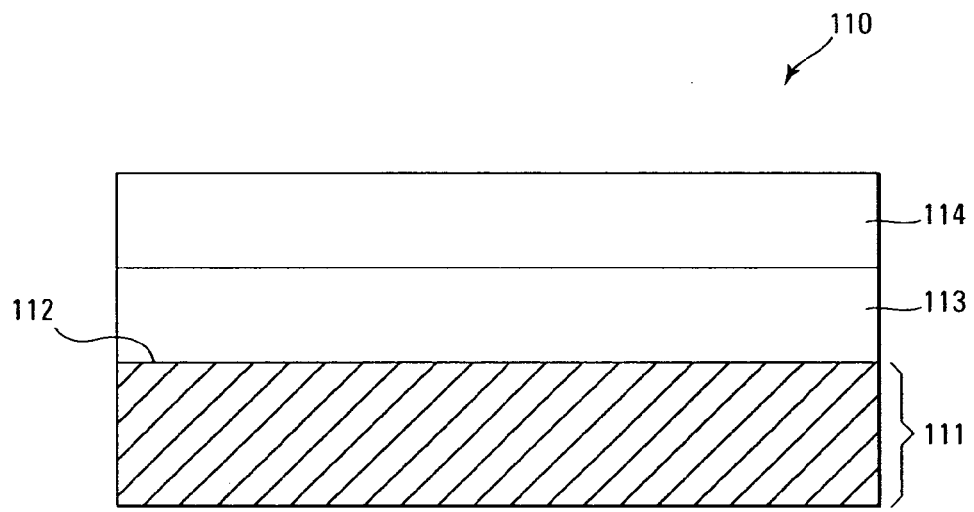
FIG. 2 is a cross-sectional view of a device structure including a tantalum silicon nitride diffusion barrier layer according to an embodiment of the present invention.
Figure 3:
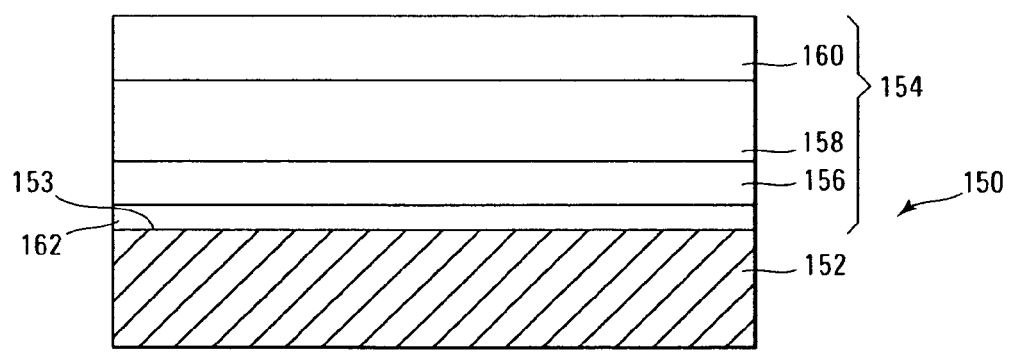
FIG. 3 is a cross-sectional view of a structure showing a high dielectric capacitor including an electrode having a tantalum silicon nitride diffusion barrier layer according to an embodiment of the present invention.

Use of the barrier layers of the present invention in semiconductor constructions shall be described generally with reference to FIGS. 2 and 3.

FIG. 2 is a cross-sectional view of a structure 110 including a substrate assembly 111 and a tantalum silicon nitride diffusion barrier layer 113 according to the present invention formed on a surface 112 of the substrate assembly 111, e.g., a silicon containing surface. The structure 110 further includes a conductive layer 114 (e.g., a copper layer). The structure 110 is illustrative of the use of a tantalum silicon nitride diffusion barrier layer for any application requiring an effective barrier layer, for example, to prevent diffusion from a silicon containing surface. In other words, the tantalum silicon nitride diffusion barrier layer 113 may be used in the fabrication of semiconductor devices wherever it is necessary to prevent the diffusion of one material to an adjacent material. For example, the substrate assembly 111 may be representative of a contact structure having an opening extending to a silicon containing surface. In such a structure, diffusion barriers are commonly used in such openings to prevent undesirable reactions, such as the reaction of a conductive contact material, e.g, copper or aluminum, with the silicon containing surface.

Further, for example, the tantalum silicon nitride diffusion barrier layer 113 may be used in the formation of storage cell capacitors for use in semiconductor devices, e.g., memory devices. As further described herein, the tantalum silicon nitride diffusion barrier layer is used within a stack of layers forming an electrode of a capacitor, e.g., the other layers including layers formed of materials such as platinum, ruthenium oxide, etc. One skilled in the art will recognize that various semiconductor processes and structures for various devices, e.g., CMOS devices, memory devices, etc., would benefit from the barrier characteristics of the barrier layers of the present invention and in no manner is the present invention limited to the illustrative embodiments described herein.

FIG. 3 is a cross-sectional view of a structure 150 including substrate assembly 152 (e.g., a silicon substrate) and capacitor structure 154 formed relative thereto. Capacitor structure 154 includes a first electrode 156, a second electrode 160, and a high dielectric constant layer 158 interposed therebetween. For example, the dielectric layer may be any suitable material having a desirable dielectric constant, such as $TiO_2$, $ZrO_2$, $HfO_2$, $Ta_2O_5$, $(Ba,Sr)TiO_3$, $Pb(Zr,Ti)O_3$, or $SrBi_2Ti_2O_9$. With use of the high dielectric constant layer 158, diffusion barrier properties of the electrodes is particularly important. For example, to function well in a bottom electrode of a capacitor structure, the electrode layer or electrode stack must act as an effective barrier to the diffusion of silicon, particularly due to the processes used to form the high dielectric constant materials. Such diffusion barrier properties are highly desirable when the substrate assembly 152 includes a silicon-containing surface 153 upon which the capacitor is formed, e.g., polysilicon, silicon substrate material, n-doped silicon, p-doped silicon, etc., since oxidation of the diffused silicon to form silicon dioxide may result in degraded capacitance, e.g., capacitance for a memory device. In addition, it is desirable for the electrode stack to act as an oxygen barrier (e.g., diffusion barrier layer 162) to protect the silicon-containing surface under the stack from oxidizing. The formation of the tantalum silicon nitride diffusion barrier layer enhances the barrier properties of the stack.

It is to be understood that FIGS. 2 and 3 are exemplary constructions, and methods of the invention can be useful for forming layers on any substrate, preferably on semiconductor structures, and that such applications include capacitors such as planar cells, trench cells, (e.g., double sidewall trench capacitors), stacked cells (e.g., crown, V-cell, delta cell, multi-fingered, or cylindrical container stacked capacitors), as well as field effect transistor devices.

The following examples are offered to further illustrate various specific embodiments and techniques of the present invention. It should be understood, however, that many variations and modifications understood by those of ordinary skill in the art may be made while remaining within the scope of the present invention. Therefore, the scope of the invention is not intended to be limited by the following example. Unless specified otherwise, all percentages shown in the examples are percentages by weight.

EXAMPLES

A tantalum silicon nitride layer is deposited on a substrate by ALD using alternate pulses of a precursor of the formula (Formula I) (5 seconds, 100 sccm helium carrier); air purge (20 seconds, 500 sccm); ammonia (5 seconds, 1000 sccm); and air purge (20 seconds, 300 sccm). A sufficient number of cycles are run to give the desired thickness of the film.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a metal-containing layer on a substrate, the method comprising:
providing a substrate;
providing a vapor comprising at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group;
contacting the vapor comprising the at least one compound of Formula I with the substrate to form a tantalum silicon nitride layer on at least one surface of the substrate using an atomic layer deposition process comprising a plurality of deposition cycles, wherein the tantalum silicon nitride layer is formed without using additional silicon-containing precursors.

2. The method of claim 1 wherein each $R^1$, $R^2$, and $R^3$ is independently hydrogen or an organic group having 1 to 10 carbon atoms.

3. The method of claim 1 wherein the silicon-containing organic group is a group having the formula —$SiR^4R^5R^6$, wherein each $R^4$, $R^5$, and $R^6$ is independently hydrogen or an organic group.

4. The method of claim 3 wherein each $R^4$, $R^5$, and $R^6$ is independently hydrogen or an organic group having 1 to 10 carbon atoms.

5. The method of claim 3 wherein each $R^4$, $R^5$, and $R^3$ is independently an aliphatic group.

6. The method of claim 5 wherein each $R^4$, $R^5$, and $R^3$ is independently an aliphatic moiety having 1 to 10 carbon atoms.

7. The method of claim 1 wherein the at least one surface of the substrate is a silicon-containing surface.

8. The method of claim 1 wherein the at least one surface of the substrate is not a silicon-containing surface.

9. The method of claim 1 further comprising providing at least one reaction gas.

10. The method of claim 9 wherein the at least one reaction gas is selected from the group consisting of hydrogen, hydrogen sulfide, hydrogen selenide, hydrogen telluride, carbon monoxide, ammonia, organic amine, silane, disilane, higher silanes, diborane, plasma, and combinations thereof.

11. A method of manufacturing a semiconductor structure, the method comprising:
providing a semiconductor substrate or substrate assembly;
providing a vapor comprising at least one compound of the formula (Formula I): $Ta(NR^1)(NR^2R^3)_3$, wherein each $R^1$, $R^2$, and $R^3$ is independently hydrogen or an organic group, with the proviso that at least one of $R^1$, $R^2$, and $R^3$ is a silicon-containing organic group; and
directing the vapor comprising the at least one compound of Formula I to the semiconductor substrate or substrate assembly to form a tantalum silicon nitride layer on at least one surface of the semiconductor substrate or substrate assembly using an atomic layer deposition process comprising a plurality of deposition cycles, wherein the tantalum silicon nitride layer is formed without using additional silicon-containing precursors.

12. The method of claim 11 further comprising providing a vapor comprising at least one metal-containing compound different than Formula I, and directing the vapor comprising the at least one metal-containing compound different than Formula I to the substrate.

13. The method of claim 12 wherein the metal of the at least one metal-containing compound different than Formula I is selected from the group consisting of Ti, Ta, W, and combinations thereof.

14. The method of claim 12 wherein during the atomic layer deposition process, the metal-containing layer is formed by alternately introducing the vapor comprising the at least one compound of Formula I and the vapor comprising the at least one metal-containing compound different than Formula I during each deposition cycle.

15. The method of claim 12 further comprising providing at least one reaction gas.

16. The method of claim 11 wherein the metal-containing layer has a thickness of 1 Å to 500 Å.

17. The method of claim 11 wherein the metal-containing layer is a conductive barrier layer.

18. A method of manufacturing a semiconductor structure, the method comprising:

providing a semiconductor substrate or substrate assembly within an atomic layer deposition chamber;

providing a vapor comprising at least one compound of the formula (Formula I): Ta(NR$^1$)(NR$^2$R$^3$)$_3$3, wherein each R$^1$, R$^2$, and R$^3$ is independently hydrogen or an organic group, with the proviso that at least one of R$^1$, R$^2$, and R$^3$ is a silicon-containing organic group;

directing the vapor comprising the at least one compound of Formula I to the semiconductor substrate or substrate assembly and allowing the at least one compound to chemisorb to at least one surface of the semiconductor substrate or substrate assembly to form a tantalum silicon nitride layer on at least one surface of the semiconductor substrate or substrate assembly, wherein the tantalum silicon nitride layer is formed without using additional silicon-containing precursors.

19. The method of claim 18 further comprising providing at least one reaction gas and directing the reaction gas to the semiconductor substrate or substrate assembly.

20. The method of claim 19 wherein directing the vapor comprising the at least one compound of Formula I to the semiconductor substrate or substrate assembly, and directing the reaction gas to the semiconductor substrate or substrate assembly, are repeated at least once.

21. The method of claim 18 wherein the temperature of the semiconductor substrate or substrate assembly is 25° C. to 40° C.

22. The method of claim 18 wherein the atomic layer deposition chamber containing the semiconductor substrate or substrate assembly has a pressure of $10^{-8}$ torr ($1.3 \times 10^{-6}$ Pa) to 10 torr ($1.3 \times 10^3$ Pa).

23. The method of claim 18 further comprising purging excess vapor comprising the at least one compound of Formula I from the deposition chamber after chemisorption of the compound onto the semiconductor substrate or substrate assembly.

24. The method of claim 23 wherein purging comprises purging with an inert gas.

25. The method of claim 24 wherein the inert gas is selected from the group consisting of nitrogen, helium, argon, and mixtures thereof.

26. A method of manufacturing a memory device structure, the method comprising:

providing a substrate comprising a silicon-containing surface;

providing a vapor comprising at least one compound of the formula (Formula I): Ta(NR$^1$)(NR$^2$R$^3$)$^3$, wherein each R$^1$, R$^2$, and R$^3$ is independently hydrogen or an organic group, with the proviso that at least one of R$^1$, R$^2$, and R$^3$ is a silicon-containing organic group;

contacting the vapor comprising the at least one compound of Formula I with the substrate to chemisorb the compound on the silicon-containing surface of the substrate;

providing at least one reaction gas;

contacting the at least one reaction gas with the substrate having the chemisorbed compound thereon to form a tantalum silicon nitride barrier layer on the silicon-containing surface of the substrate, wherein the tantalum silicon nitride layer is formed without using additional silicon-containing precursors;

providing a first electrode on the barrier layer;

providing a high dielectric material on at least a portion of the first electrode; and providing a second electrode on the high dielectric material.

27. The method of claim 26 wherein the vapor comprising the at least one compound of Formula I further comprises a nonreactive gas.

28. The method of claim 27 wherein the nonreactive gas is selected from the group consisting of nitrogen, helium, argon, and mixtures thereof.

* * * * *

UNITED STATES PATENT AND TRADEMARK OFFICE
CERTIFICATE OF CORRECTION

PATENT NO. : 7,521,356 B2
APPLICATION NO. : 11/217949
DATED : April 21, 2009
INVENTOR(S) : Ramaswamy et al.

It is certified that error appears in the above-identified patent and that said Letters Patent is hereby corrected as shown below:

In column 16, line 15, in Claim 5, delete "$R^3$" and insert -- $R^6$ --, therefor.

In column 16, line 17, in Claim 6, delete "$R^3$" and insert -- $R^6$ --, therefor.

In column 16, line 37, in Claim 11, delete "$Ta(NR^1)(NR^2R^3)\ ^3$," and insert -- $Ta(NR^1)(NR^2R^3)_3$, --, therefor.

In column 16, line 67, in Claim 16, delete "1 Åto" and insert -- 1 Å to --, therefor.

In column 17, line 9, in Claim 18, delete "$Ta(NR^1)(NR^2R^3)^3 3$," and insert -- $Ta(NR^1)(NR^2R^3)_3$, --, therefor.

In column 17, line 33, in Claim 21, delete "40° C." and insert -- 400° C. --, therefor.

In column 18, line 14, in Claim 26, delete "$Ta(NR^1)(NR^2R^3)^3$," and insert -- $Ta(NR^1)(NR^2R^3)_3$, --, therefor.

Signed and Sealed this

Fourteenth Day of July, 2009

JOHN DOLL
*Acting Director of the United States Patent and Trademark Office*